(12) United States Patent
Uemura (10) Patent No.: US 11,035,910 B2
(45) Date of Patent: Jun. 15, 2021

(54) MAGNETIC SUBSTANCE DETECTION SENSOR

(71) Applicant: ABLIC Inc., Chiba (JP)

(72) Inventor: Hirotaka Uemura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/811,228

(22) Filed: Mar. 6, 2020

(65) Prior Publication Data

US 2020/0309868 A1 Oct. 1, 2020

(30) Foreign Application Priority Data

Mar. 29, 2019 (JP) .............................. JP2019-065333
Nov. 29, 2019 (JP) .............................. JP2019-216043

(51) Int. Cl.
*G01R 33/038* (2006.01)
*G01R 33/00* (2006.01)

(52) U.S. Cl.
CPC ....... *G01R 33/038* (2013.01); *G01R 33/0047* (2013.01); *G01R 33/0076* (2013.01)

(58) Field of Classification Search
CPC .............. G01R 33/038; G01R 33/0047; G01R 33/0076; G01R 33/0052; G01D 11/245; G01D 5/147; G01V 3/08; H01L 43/02; H01L 23/3135; H01L 23/3121
USPC ....................................................... 324/205
See application file for complete search history.

(56) References Cited

U.S. PATENT DOCUMENTS

| | | | | |
|---|---|---|---|---|
| 5,434,105 A | * | 7/1995 | Liou | H01L 23/3135 257/E23.092 |
| 5,508,611 A | * | 4/1996 | Schroeder | F02P 7/07 174/545 |
| 5,581,170 A | * | 12/1996 | Mammano | H02J 7/0019 320/116 |
| 6,545,332 B2 | * | 4/2003 | Huang | H01L 24/97 257/433 |
| 6,545,457 B2 | * | 4/2003 | Goto | G01R 33/07 324/117 H |
| 7,385,394 B2 | * | 6/2008 | Auburger | G01P 3/488 324/207.25 |
| 8,089,276 B2 | | 1/2012 | Kentsch | |
| 9,494,660 B2 | * | 11/2016 | David | H01L 23/49562 |
| 10,234,513 B2 | * | 3/2019 | Vig | G01B 7/30 |
| 2010/0188078 A1 | * | 7/2010 | Foletto | G01R 33/0023 324/251 |
| 2010/0201356 A1 | * | 8/2010 | Koller | B29C 45/14639 324/252 |
| 2011/0127998 A1 | * | 6/2011 | Elian | G01R 33/093 324/219 |

(Continued)

*Primary Examiner* — Christopher P McAndrew
(74) *Attorney, Agent, or Firm* — Brinks Gilson & Lione (57) ABSTRACT

A magnetic substance detection sensor includes a support substrate, a semiconductor chip provided on the support substrate and having a magnetic field detection element, a permanent magnet provided on the support substrate, and a resin encapsulation layer covering the semiconductor chip and the permanent magnet. The resin encapsulation layer has a first resin layer exposing the permanent magnet and covering the semiconductor chip, and a second resin layer continuously covering the permanent magnet and the first resin layer, and stress caused by curing contraction of the second resin layer is smaller than that of the first resin layer.

6 Claims, 7 Drawing Sheets

(56) References Cited

U.S. PATENT DOCUMENTS

| | | | |
|---|---|---|---|
| 2015/0355291 A1* | 12/2015 | Elian | G01R 33/06 |
| | | | 324/207.2 |
| 2020/0118838 A1* | 4/2020 | Hammond | B81C 1/00333 |
| 2020/0132520 A1* | 4/2020 | Katsuhara | G01D 11/245 |
| 2020/0154576 A1* | 5/2020 | Chainer | H01L 21/565 |
| 2020/0161258 A1* | 5/2020 | Soga | H01L 24/05 |
| 2020/0161259 A1* | 5/2020 | Otsubo | H01L 23/544 |
| 2020/0203187 A1* | 6/2020 | Chew | H01L 23/295 |
| 2020/0203188 A1* | 6/2020 | Chew | H01L 24/24 |
| 2020/0350241 A1* | 11/2020 | Kim | H01L 23/49816 |

* cited by examiner

MAGNETIC SUBSTANCE DETECTION SENSOR

RELATED APPLICATIONS

This application claims priority to Japanese Patent Application Nos 2019-065333, filed on Mar. 29, 2019, and 2019-216043, filed on Nov. 29, 2019, the entire contents of which are incorporated herein by reference.

BACKGROUND OF THE INVENTION

1. Field of the Invention

The present invention relates to a magnetic substance detection sensor.

2. Description of the Related Art

A magnetic substance detection sensor having a permanent magnet which generates a magnetic field, and a magnetic field detection element which detects a change in magnetic field has heretofore been known. Magnetization of an object of detection is not required by the magnetic substance detection sensor for the purpose of detection of the proximity of the object. Hence noncontact detection of the proximity of the object can be easily made by the magnetic substance detection sensor as compared with the use of a general magnetic sensor detecting the proximity of a permanent magnet.

The magnetic substance detection sensor detects the proximity of an object of detection made from a magnetic substance having a small permanent magnetization and a large permeability. The object of detection measured by the magnetic substance detection sensor may include, for example, a member made of a magnetic material such as iron, magnetic paint containing magnetic substance particles, and the like.

The magnetic substance detection sensor is used to detect rotation of a gear and to detect patterns of the magnetic paint.

As a magnetic substance detection sensor having a magnetic field detection element, a permanent magnet, and a resin encapsulation sealing above elements has been proposed (refer to, U.S. Pat. No. 8,089,276, for example).

In a conventional magnetic substance detection sensor, since the magnetic field detection element and the permanent magnet are sealed with the resin encapsulation, there have been cases where stress caused by curing contraction of the resin encapsulation (hereinafter may be called package stress applied to the magnetic field detection element to greatly shift the characteristics so that sufficient accuracy is not obtained. That is, there have been cases where the proximity of the object of detection is not detected correctly in the conventional magnetic substance detection sensor.

SUMMARY OF THE INVENTION

It is an object of the present invention to provide a magnetic substance detection sensor with reduced package stress and capable of detecting the proximity of an object of detection with high accuracy.

There is provided a magnetic substance detection sensor according to one aspect of the present invention, the magnetic substance detection sensor includes a support substrate, a semiconductor chip provided on the support substrate and having a magnetic field detection element, a permanent magnet provided on the support substrate, and a resin encapsulation layer covering the semiconductor chip and the permanent magnet. The resin encapsulation layer has a first resin layer exposing the permanent magnet and covering the semiconductor chip, and a second resin layer continuously covering the permanent magnet and the first resin layer, and stress caused by curing contraction of the second resin layer is smaller than that of the first resin layer.

According to the magnetic substance detection sensor of the present invention, since stress caused by curing contraction of the second resin layer is smaller than that of the first resin layer, the package stress applied to the semiconductor chip can be reduced and the proximity of an object can be detected with high accuracy as compared with the case of the resin encapsulation layer of a single layer.

BRIEF DESCRIPTION OF THE DRAWINGS

FIG. A is a plan view illustrating a magnetic substance detection sensor of the first embodiment of the present invention.

DETAILED DESCRIPTION OF THE PREFERRED EMBODIMENTS

Hereinafter, magnetic substance detection sensors of the present invention will be described in detail with reference to the accompanying drawings. The drawings used in the following description may show the feature parts which are enlarged for convenience in order to make the features of the present invention easier to understand. The dimension ratios of the respective components or the like may be therefore different from the actual ones. In addition, the materials, dimensions, and the like exemplified in the following description are examples. Accordingly, the present invention is not limited only to the embodiments illustrated below and can be appropriately changed and implemented within a scope not changing the requirements of the present invention.

First Embodiment

Figure 1A:
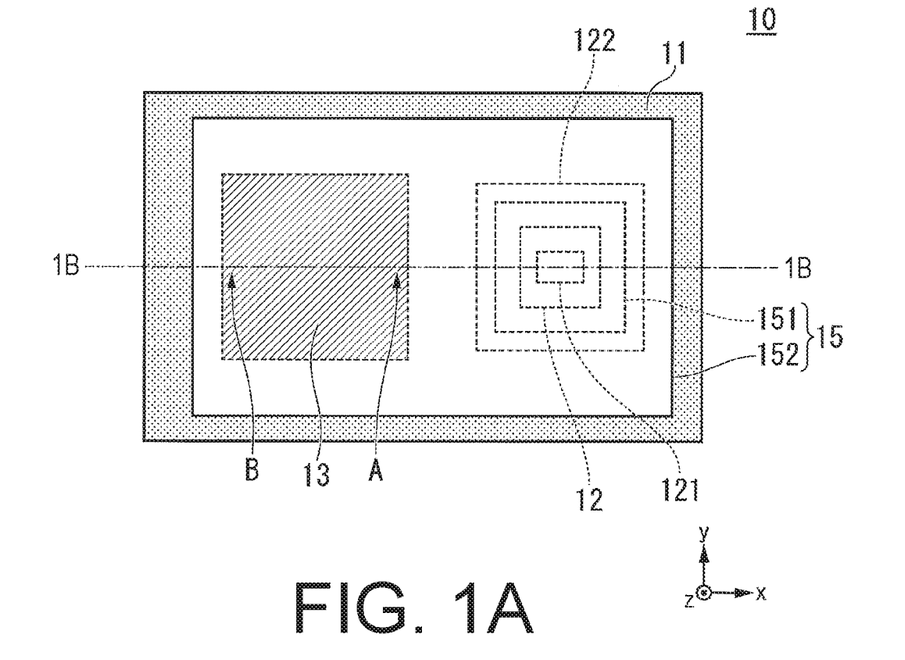
Figure 1B:
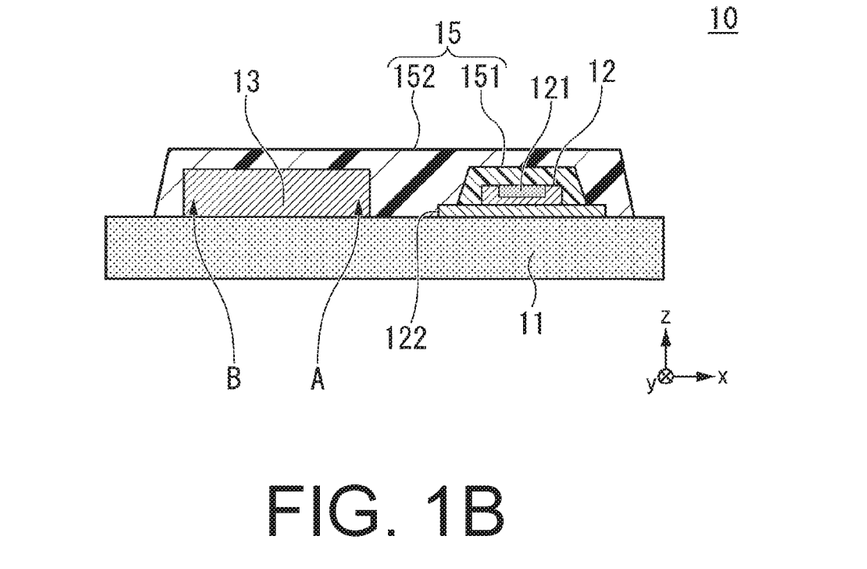
FIG. 1B is a sectional view taken along line 1B-1B of the magnetic substance detection sensor illustrate in FIG. 1A.

FIG. 1A is a plan view illustrating a magnetic substance detection sensor of the first embodiment of the present invention. FIG. 1B is a sectional view taken along line 1B-1B of the magnetic substance detection sensor illustrated in FIG. 1A.

An object of detection of the magnetic substance detection sensor 10 is a magnetic substance. The object of detection is not limited particularly, but may include, for example, a member made of a magnetic material such as iron, magnetic paint containing magnetic substance particles, and the like.

As illustrated in FIGS. 1A and 1B, the magnetic substance detection sensor 10 has a support substrate 11, a semiconductor chip 12 provided over the support substrate 11, a permanent magnet 13 provided on the support substrate 11, and a resin encapsulation layer 15 which covers the semiconductor chip 12 and the permanent magnet 13. The resin encapsulation layer 15 has a resin layer 151 (corresponding to a first resin layer in claims), and a resin layer 152 (corresponding to a second resin layer in claims).

The support substrate 11 may be a flexible substrate or may be a hard (rigid substrate. The support substrate 11 has unillustrated wirings each made of a conductive material such as Cu, and an output terminal to which a wiring is electrically connected.

The surface of the support substrate 11 is preferably formed of a material with high adhesion to the resin layer 152 of the resin encapsulation layer 15. As a support substrate 11, for example, a printed circuit board whose surface is covered with a resist can be used.

As illustrated in FIGS. 1A and 1B, the semiconductor chip 12 is provided over the support substrate 11 through a conductive layer 122 provided on the support substrate 11. The semiconductor chip 12 is surrounded by the resin layer 151 of the resin encapsulation layer 15 and the conductive layer 122.

The conductive layer 122 is preferably formed of a conductive material with high adhesion to the resin layer 151 of the resin encapsulation layer 15 and the resin layer 152. Specifically, the conductive layer 122 which is made of, for example, a metal such as Cu—Sn alloy, Cu—Fe alloy, or the like can be used.

The semiconductor chip 12 includes a magnetic field detection element 121. As illustrated in FIGS. 1A and 1B, the magnetic field detection element 121 is disposed on an upper surface of the semiconductor chip 12. The magnetic field detection element 121 may include, for example, a Hall element. The magnetic field detection element 121 provides an output corresponding to the magnetic field component in the z-axis direction vertical direction in FIG. 1B).

In the magnetic substance detection sensor 10 an electrical connection is made to take out an output signal of the magnetic substance detection sensor 10 from the semiconductor chip 12. Specifically, the semiconductor chip 12 and the conductive layer 122 are connected by an unillustrated bonding wire. Further, the conductive layer 122 and the unillustrated wiring made of the conductive material such as Cu which is disposed in the support substrate 11 are connected by soldering, and the wiring and the unillustrated output terminal are electrically connected within the support substrate 11 by another wiring.

The permanent magnet 13 is provided on the support substrate 11. The permanent magnet 13 has different magnetic poles A and B, and the direction connecting the magnetic poles A and B is a magnetization direction. In the permanent magnet 13, for example, the magnetic pole A is an N pole, and the magnetic pole B is an S pole. In the first embodiment, as illustrated in FIG. 1A, the magnetic field detection element 121 is disposed at a position along the magnetization direction of the permanent magnet 13 provided on the support substrate 11. As illustrated in FIGS. 1A and 1B, the permanent magnet 13 is surrounded by the resin layer 152 of the resin encapsulation layer 15 and the support substrate 11.

The resin layer 151 exposes the permanent magnet 13 and covers the semiconductor chip 12. The resin layer 151 covers only the upper and side surfaces of the semiconductor chip 12 and the vicinity of the boundary between the conductive layer 122 and the semiconductor chip 12.

Further, the resin layer 152 continuously covers the permanent magnet 13 and the resin layer 151. The resin layer 152 covers the upper and side surfaces of the permanent magnet 13 and the resin layer 151, a part of the conductive layer 122 uncovered with the resin layer 151, and a major part of the exposed part of the upper surface of the support substrate 11. The unillustrated wiring made of the conductive material such as Cu and other possible elements provided in the support substrate 11 are preferably covered by the resin layer 152.

The semiconductor chip 12 is covered by two layers: the resin layer 151 of the resin encapsulation layer 15; and the resin layer 152 which covers the resin layer 151. The semiconductor chip 12 is protected from mechanical stimulation and water by the resin layer 151 of the resin encapsulation layer 15, which is mainly disposed in contact with the semiconductor chip 12.

Further, the permanent magnet 13 is covered only by the resin layer 152 of the resin encapsulation layer 15. The permanent magnet 13 is protected from the mechanical stimulation and water only by the resin layer 152 of the resin encapsulation layer 15.

In the resin encapsulation layer 15 of the magnetic substance detection sensor 10, stress caused by curing contraction of the resin layer 152 is smaller than that of the resin layer 151 (having a smaller package stress). The higher the glass transition temperature (Tg) of the resin is, the larger the stress caused by the curing contraction is. Further, the larger the elastic modulus of the resin is, the larger the stress caused by the curing contraction is.

The resin encapsulation layer 15 in which the package stress of the resin layer 152 is smaller than that of the resin layer 151 is preferably any one of, for example, (1) to (3) illustrated below:

(1) In which the glass transition temperature of the resin layer 151 is higher than that of the resin layer 152, (2) In which the elastic modulus of the resin layer 151 is larger than that of the resin layer 152, and (3) In which the glass transition temperature of the resin layer 151 is higher than that of the resin layer 152, and the elastic modulus of the resin layer 151 is larger than that of the resin layer 152.

In the case where the resin encapsulation layer 15 corresponds to any of (1) to (3), contribution of the resin layer 152 to the stress caused by the curing contraction applied to the semiconductor chip 12 is further reduced. As a result, the package stress applied to the semiconductor chip 12 preferably becomes smaller.

A description will now be made as to simulation done to examine the relation between the elastic modulus of the second resin layer of the magnetic substance detection sensor and the package stress applied to the semiconductor chip.

Figure 2A:
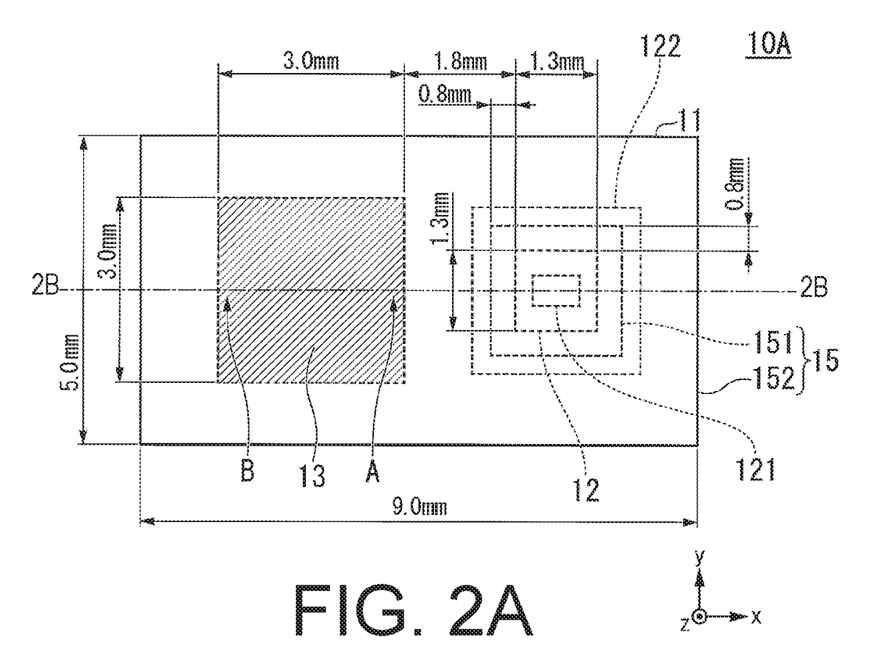
FIG. 2A is a plan view to describe the shape of a magnetic substance detection sensor to which simulation has been performed.
Figure 2B:
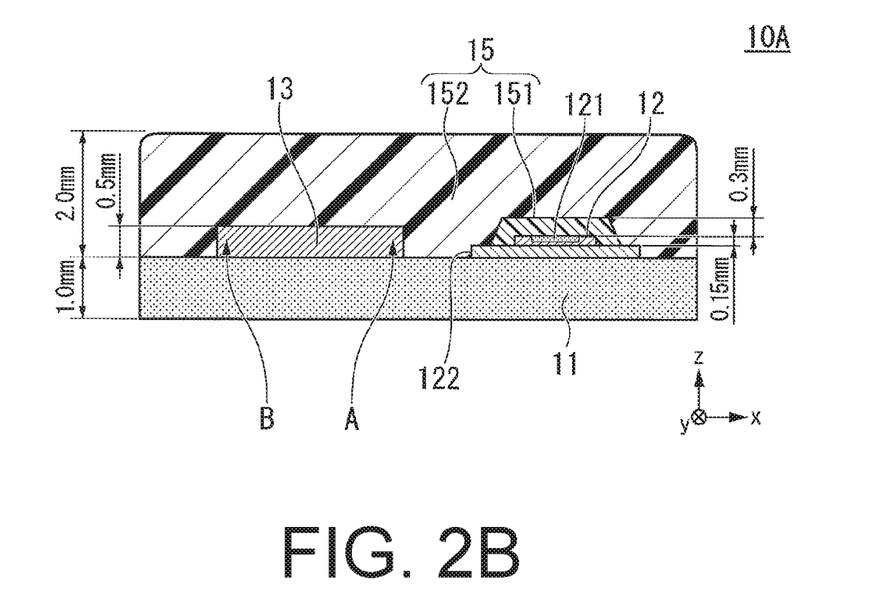
FIG. 2B is a sectional view taken along line 2B-2B of the magnetic substance detection sensor illustrated in FIG. 2A.
Figure 3:
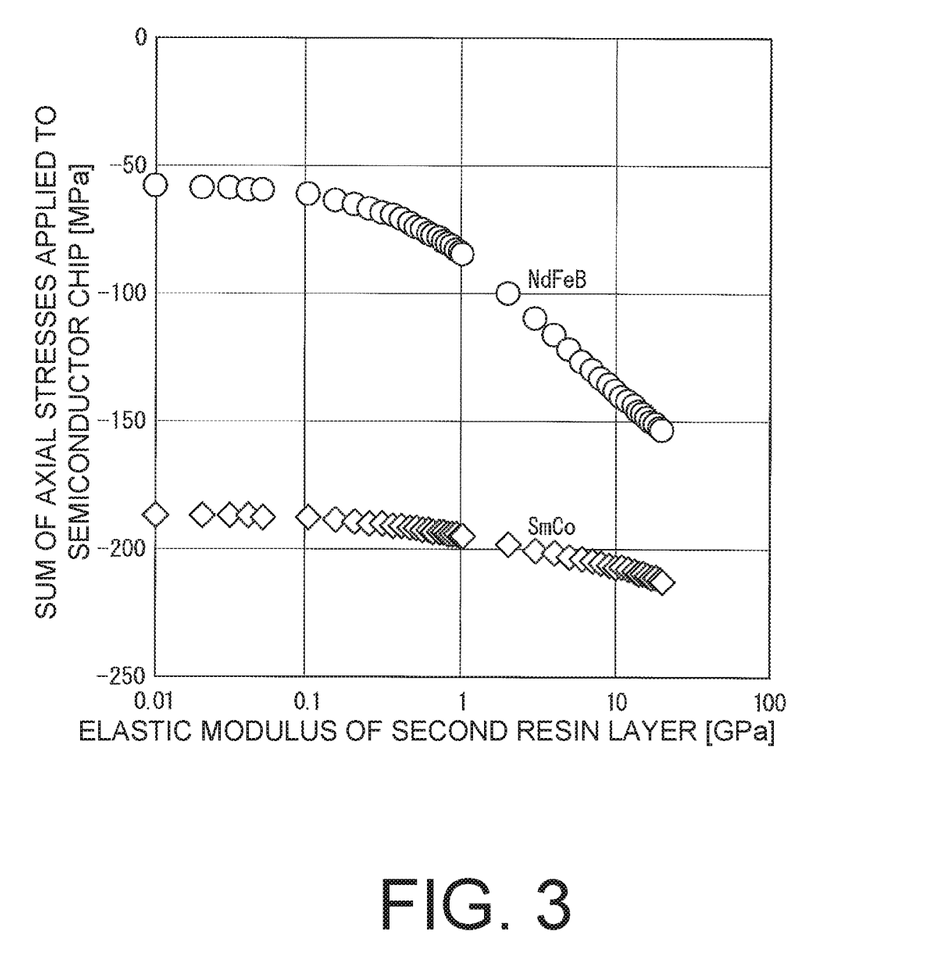
FIG. 3 is a graph illustrating a relation between the elastic modulus of the second resin layer and the package stress applied to the semiconductor chip.

FIG. 2A is a plan view to describe the shape of a magnetic substance detection sensor to which simulation has been performed. FIG. 2B is a sectional view taken along line 2B-2B of the magnetic substance detection sensor illustrated in FIG. 2A. In the magnetic substance detection sensor 10A illustrated in FIGS. 2A and 2B, the same members as those in the magnetic substance detection sensor 10 illustrated in FIGS. 1A and 1B are denoted by the same reference numerals, and their dual explanations will be omitted. FIG. 3 is a graph illustrating the relation between the elastic modulus of the second resin layer and the package stress applied to the semiconductor chip.

The simulation has been performed while developing a known stress calculation method. In the known stress calculation method, a detailed multilayer structure is only assumed for a layer structure along a single direction (e.g., the z-axis direction) of a planar structure which is orthogonal to the main stress axis (e.g., the x-axis), and an equation obtained from the balance of force and the continuity of displacement is solved. More specifically, assuming that the displacement is continuous, and that the bending radius in each layer is equal, the balance equation is solved for an axial force and a bending moment acting on each layer, to thereby determine axial stress. On the other hand, in the present simulation, the overall planar structure orthogonal to the main stress axis (e.g., the x-axis), i.e., a multi-column structure is assumed for the yz plane, and each column is assumed to have equal bending radius in its main stress axial direction. Then, an equation constituted from the balance of force and the continuity of displacement is solved.

In the present simulation, under conditions shown below, at 25° C. the sum of the axial stresses in the x-axis direction and the axial stress in the y-axis direction at the semiconductor chip 12 of the magnetic substance detection sensor 10A illustrated in FIG. 2 is calculated as the package stress applied to the semiconductor chip. Incidentally, in the present simulation, the conductive layer 122 illustrated in FIG. 2 is omitted because the contribution to the stress caused by curing contraction is small. The ordinate of FIG. 3 which shows the result of the simulation is the sum of the axial stresses in the x-axis direction and the axial stress in the y-axis direction expressed in MPa, and the abscissa is the elastic modulus of the second resin layer expressed in GPa.

The conditions for the above simulation are as follows:
(a) Concerning Support Substrate 11

The thickness of the support substrate 11 is assumed to be 1.0 mm as illustrated in FIG. 2B. Also, as illustrated in FIG. 2A, the length of the support substrate 11 in the x direction is assumed to be 9.0 mm, and the length in the y direction is assumed to be 5.0 mm. Further, the elastic modulus of the support substrate 11 is assumed to be 25 GPa, and its linear expansion coefficient is assumed to be 7 ppm/° C.
(b) Concerning Semiconductor Chip 12

The thickness of the semiconductor chip 12 is assumed to be 0.15 mm as illustrated in FIG. 2B. Further, as illustrated in FIG. 2A, the length of the semiconductor chip 12 in the x and y directions is assumed to be 1.3 mm.

The semiconductor chip 12 is assumed to be formed of a silicon substrate, the elastic modulus is assumed to be 168 GPa, and the linear expansion coefficient is assumed to be 2.6 ppm/° C.
(c) Concerning Permanent Magnet 13

The thickness of the permanent magnet 13 is assumed to be 0.5 mm as illustrated in FIG. 2B. Also, as illustrated in FIG. 2A, the length of the permanent magnet in the x and y directions is assumed to be 3.0 mm.

Further, the distance in the x direction between the permanent magnet 13 and the semiconductor chip 12 is assumed to be 1.8 mm.

Two types of a magnet made of NdFeB and a magnet made of SmCo are used as the permanent magnet 13.

An elastic modulus of the magnet made of NdFeB is assumed to be 167 GPa, and the linear expansion coefficient relative to the vertical direction of the magnetization is assumed to be −1.5 ppm/° C.

An elastic modulus of the magnet made of SmCo is assumed to be 118 GPa, and the linear expansion coefficient relative to the vertical direction of the magnetization is assumed to be 10 ppm/° C.
(d) Concerning Resin Layer 151

As illustrated in FIG. 2B, the thickness of the resin layer 151 is assumed to be 0.3 mm from the upper surface of the semiconductor chip 12. Further, as illustrated in FIG. 2A, the distance between the edge of the resin layer 151 and the side surface of the semiconductor chip 12 is assumed to be 0.8 mm in the x and y directions.

The glass transition temperature of the resin layer 151 is assumed to be 125° C., the linear expansion coefficient at the glass transition temperature or lower is assumed to be 12 ppm/° C., and the elastic modulus is assumed to be 25 GPa.
(e) Concerning Resin Layer 152

As illustrated in FIG. 2B, the thickness of the resin layer 152 is assumed to be 2.0 mm from the upper surface of the support substrate 11. Further, as illustrated in FIGS. 2A and 2B, the length of the resin layer 152 in the x and y directions is assumed to be the same dimension as that of the support substrate 11.

The glass transition temperature of the resin layer 152 is assumed to be 125° C., and the linear expansion coefficient at the glass transition temperature or lower is assumed to be 12 ppm/° C. The elastic modulus of the resin layer 152 is assumed to be in the range from 0.01 GPa to 20 GPa.

It is understood from the simulation result illustrated in FIG. 3 that by reducing the elastic modulus of the resin layer 152, the package stress applied to the semiconductor chip 12 is reduced and approaches zero in a structure where the resin encapsulation layer 15 has the resin layer 151 covering the semiconductor chip and the resin layer 152 covering the resin layer 151 even in the case where the magnet made of NdFeB is used as the permanent magnet 13, and where the magnet made of SmCo is used as the permanent magnet 13. In addition, it has been confirmed that the simulation used for obtaining the result illustrated in FIG. 3 has a high correlation with actual experimental results with respect to the resin-encapsulated magnetic sensor.

In order to protect the semiconductor chip 12 from the mechanical stimulation and water, the glass transition temperature (Tg) of the resin layer 151 is preferably 85° C. or higher, more preferably 125° C. or higher.

In order to protect the semiconductor chip 12 from the mechanical stimulation and water, the resin layer 151 preferably has a enough elastic modulus in a practical temperature range, e.g., a range from −40° C. to 85° C. The elastic modulus of the resin layer 151 is preferably in a range of 1 to 30 GPa, more preferably in a range of 1 to 10 GPa.

In order to suppress the package stress of the resin encapsulation layer 15, the glass transition temperature (Tg) of the resin layer 152 is preferably in a range lower than 85° C., more preferably in a range lower than −10° C.

In order to suppress the package stress of the resin encapsulation layer 15, the elastic modulus of the resin layer 152 is preferably smaller than 1 GPa, more preferably smaller than 0.1 GPa.

As for the resin layer 151 in which the glass transition temperature is 85° C. or higher and the elastic modulus is in the range of 1 to 30 GPa, one can utilize a material used in the standard resin package, for example, an epoxy-based resin mixed with a silica filler. An epoxy-based resin having a good fluidity such as an epoxy resin mixed with a spherical silica filler is particularly preferable for the resin layer 151. The stress caused by curing contraction applied from the resin layer 151 to the magnetic field detection element 121 becomes small as the thickness of the resin layer 151 becomes thin. The resin layer 151 made of the epoxy-based resin having a good fluidity is hence preferable because the thickness can easily be made thin.

Since the epoxy-based resin used in the resin package has in general a glass transition temperature (Tg) ranging from 100 to 160° C. and an elastic modulus ranging from 15 to 35 GPa, one can use an epoxy-based resin having, for example, the glass transition temperature at 125° C. and the elastic modulus of 25 GPa.

A polyester-based resin, a polyamide-based resin, an olefin-based resin, a urethane-based resin, or the like can be listed as a material for the resin layer 152 in which the glass transition temperature is in the range lower than 85° C. and the elastic modulus is lower than 1 GPa. Particularly even among those listed above, in the case where a glass epoxy substrate (FR4) which is a general rigid substrate is used as the support substrate 11, to have a good adhesion with the support substrate 11, the resin layer 152 is preferably made from the polyester-based resin.

Since the polyester-based resin has the glass transition temperature (Tg) ranging from −100 to 80° C., and the elastic modulus ranging from 0.01 to 0.1 GPa, one can use a polyester-based resin having, for example, the glass transition temperature at −60° C. and the elastic modulus of 0.05 GPa.

[Manufacturing Method of Magnetic Substance Detection Sensor]

A method of manufacturing the magnetic substance detection sensor 10 of the first embodiment will next be described by taking an example.

A semiconductor chip 12 is first manufactured, Specifically, a wafer processing process (wafer process) of forming an integrated circuit on a semiconductor substrate made of a silicon substrate is performed by a well-known method. In the wafer processing process, a magnetic field detection element 121 can be manufactured on the semiconductor substrate by performing a general complementary metal oxide film semiconductor (CMOS) process using a semiconductor substrate, for example. In the formation of a Hall element as the magnetic field detection element 121, there can be employed, for example, a method of ion-implanting phosphorus atoms by using a substrate having P-type conductivity as a semiconductor substrate. In the wafer processing process, a circuit for processing an output signal of the magnetic field detection element 121 may also be formed on the semiconductor substrate by the CMOS process.

The semiconductor substrate after the wafer processing process is then back-ground and diced to thereby obtain the semiconductor chip 12 cut out from the semiconductor substrate.

Next, conductive material paste which serves as a conductive layer 122 is printed at a predetermined position on a support substrate 11, and the semiconductor chip 12 is placed thereon and heated in a reflow furnace to perform assembling. The semiconductor chip 12 is hence fixed (die-attached) to the predetermined position on the support substrate 11 through the conductive layer 122.

And then, the semiconductor chip 12 and the conductive layer 122 are electrically connected by a bonding wire.

Subsequently to the above, a resin layer 151 which covers the semiconductor chip 12, the bonding wire (not illustrated), and the vicinity of the boundary between the conductive layer 122 and the semiconductor chip 12 is formed by using, for example, a mold to seal the semiconductor chip 12 and a part of the conductive layer 122.

Next, a permanent magnet 13 is fixed to a predetermined position on the support substrate 11. The permanent magnet 13 can be fixed on the support substrate 11 by an adhesive. It is preferable that the adhesive can ensure sufficient adhesive strength and showing non-magnetism in subsequent processes. Specifically, for example, a thermosetting epoxy resin or a prepreg or the like can be used as the adhesive.

Afterwards, a resin layer 152 covering the permanent magnet 13, the resin layer 151, and a part of the conductive layer 122 uncovered with the resin layer 151 is formed and sealed by using, for example, hot-melt mold.

The magnetic substance detection sensor 10 having the resin encapsulation layer 15 is obtained by the processes described above.

A description will next be made as to the operation of the magnetic substance detection sensor 10.

In a situation where the magnetic substance detection sensor 10 is sufficiently separated from an object of detection, the magnetic field detection element 121 detects only the value (Bz0) of the magnetic field component in the z-axis direction illustrated in FIGS. 1A and 1B, of a magnet field generated by the permanent magnet 13. In the case where the magnetic field detection element 121 is a Hall element, the output from the magnetic field detection element 121 is obtained as a voltage signal proportional to the value (Bz0) of the magnetic field component in the z-axis direction.

Approach of the unillustrated object of detection from the positive direction of the z-axis illustrated in FIG. 1B changes the magnetic flux of the permanent magnet 13. That is, the value (Bz1) of the magnetic field component in the z-axis direction which is detected by the magnetic field detection element 121 changes according to the distance between the object of detection and the magnetic substance detection sensor 10. Accordingly, the difference between the values of the magnetic field components in the z-axis direction detected by the magnetic field detection element 121 (difference between Bz1 and Bz0) becomes an index of the distance r between the object of detection and the magnetic substance detection sensor 10.

In the magnetic substance detection sensor 10, the output signal from the magnetic field detection element 121 is processed by an unillustrated circuit as needed. The processing of the output signal from the magnetic field detection element 121 may be, for example, a comparison of magnitude with the value (Bzt) of the predetermined magnetic field or may be amplification of the output voltage.

Assuming that the magnetic offset of the magnetic field detection element 121 is Bo, and the magnetic sensitivity is S, the output signals V1 and V0 of the magnetic field detection element 121 respectively become $V1=(Bz1+Bo)/S$, and $V0=(Bz0+Bo)/S$ with respect to the detected magnetic field components Bz1 and Bz0.

In the magnetic substance detection sensor 10, the stress caused by curing contraction of the resin which serves as the resin encapsulation layer 15 changes the magnetic offset (Bo) and sensitivity (S) of the magnetic field detection element 121 through a piezoelectric resistance effect and a piezo-Hall effect. Accordingly, the package stress makes the output signals V1 and V0 from the magnetic field detection element 121 designed for the detected magnetic field components Bz1 and Bz0 deviate from a design value. For this reason, it becomes difficult to correctly detect the distance r between the object of detection and the magnetic substance detection sensor 10 as the package stress increases.

In the magnetic substance detection sensor 10, the resin encapsulation layer 15 has the resin layer 151 and the resin layer 152 as illustrated in FIGS. 1A and 1B, and the stress caused by curing contraction of the resin layer 152 is smaller than that of the resin layer 151. Hence, as compared with the case of the resin encapsulation layer of a single layer, the magnetic substance detection sensor 10 can have a reduced the package stress applied to the semiconductor chip 12 and detect the proximity of the object of detection with high accuracy.

More specifically, the semiconductor chip 12 of the magnetic substance detection sensor 10 is covered by the two layers of the resin layer 151 and the resin layer 152 covering the resin layer 151. Since the stress caused by curing contraction the resin layer 151 is larger than that of the resin layer 152, the package stress of the resin layer 151 which is in contact with the semiconductor chip 12 is mainly applied to the semiconductor chip 12.

Since the resin layer 151 is a part of the resin encapsulation layer 15, the volume of the resin layer 151 is small as compared with the case, for example, of the resin layer of a single layer as in U.S. Pat. No. 8,089,276, and is supposed to be made from the same material which forms the resin layer 151. For this reason, even if the stress caused by curing contraction of the resin layer 151 is larger than that of the resin layer 152, the package stress applied to the semiconductor chip 12 can be reduced as compared with the case of the resin encapsulation layer of a single layer, and is supposed to be made from the same material which forms the resin layer 151.

As a result, in the magnetic substance detection sensor 10, the influence by the package stress applied to the semiconductor chip 12 on the magnetic offset (Bo) and magnetic sensitivity (S) of the magnetic field detection element 121 becomes small. Accordingly, according to the magnetic substance detection sensor 10, it is possible to accurately detect the distance r between the object of detection and the magnetic substance detection sensor 10 and detect the proximity of the object of detection with high accuracy.

Also, in the magnetic substance detection sensor 10, the semiconductor chip 12 is covered by the two layers of the resin layers 151 and 152 which form the resin encapsulation layer 15. For this reason, in the magnetic substance detection sensor 10, the semiconductor chip 12 and the bonding wire connecting the semiconductor chip 12 and the conductive layer 122 are protected from the mechanical stimulation mainly by the resin layer 151. Using the resin having high glass transition temperature (Tg) and large elastic modulus as the resin layer 151 enables prevention of cracks in the semiconductor chip 12 and disconnection of the bonding wire due to the mechanical stimulation. Further, since the semiconductor chip 12 is covered by the resin layer 151 which adheres closely to the conductive layer 122, the semiconductor chip 12 is protected from water.

In addition, in the magnetic substance detection sensor 10, the covering of the permanent magnet 13 by the resin layer 152 makes it possible to prevent separation of the permanent magnet 13 by mechanical stimulation. Further, in the magnetic substance detection sensor 10, the permanent magnet 13 is protected from water by covering the permanent magnet 13 by the resin layer 152 adhered closely to the support substrate 11.

From the above, in the present embodiment, the semiconductor chip 12 and the permanent magnet 13 are protected from the mechanical stimulation and water by the resin encapsulation layer 15, thereby making it possible to reduce the package stress without impairing reliability.

Hence, according to the present embodiment, the magnetic substance detection sensor 10 can be realized in which the package stress applied to the semiconductor chip 12 is reduced and the proximity of the object of detection can be detected with high accuracy, and which has sufficient reliability.

Figure 4A:
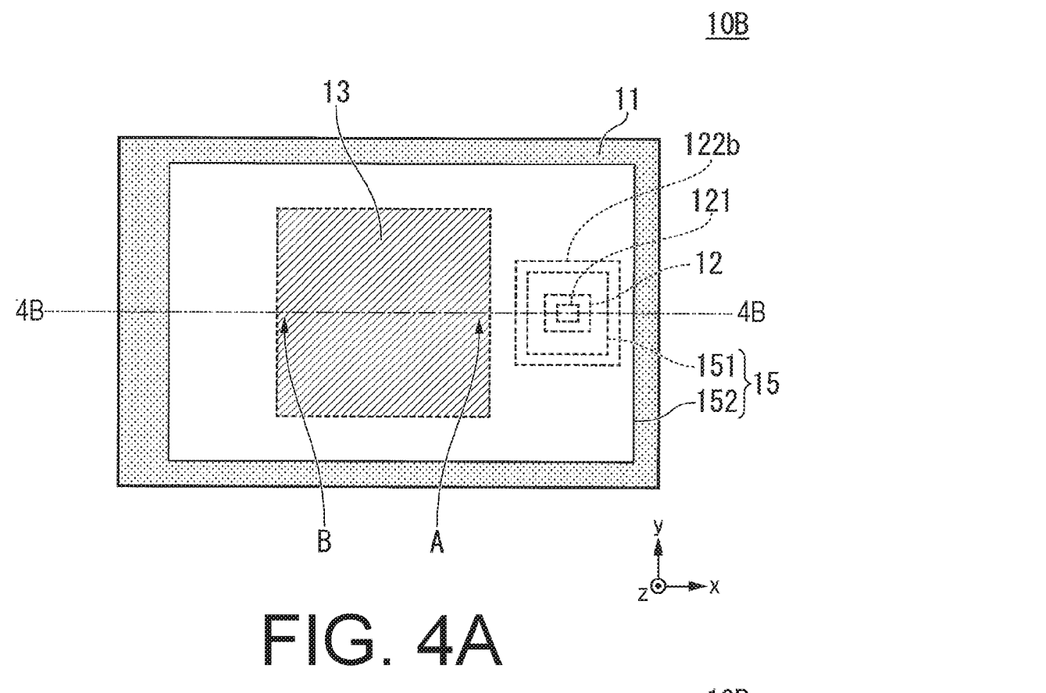
FIG. 4A is a plan view illustrating a modification of the magnetic substance detection sensor of the first embodiment of the present invention.
Figure 4B:
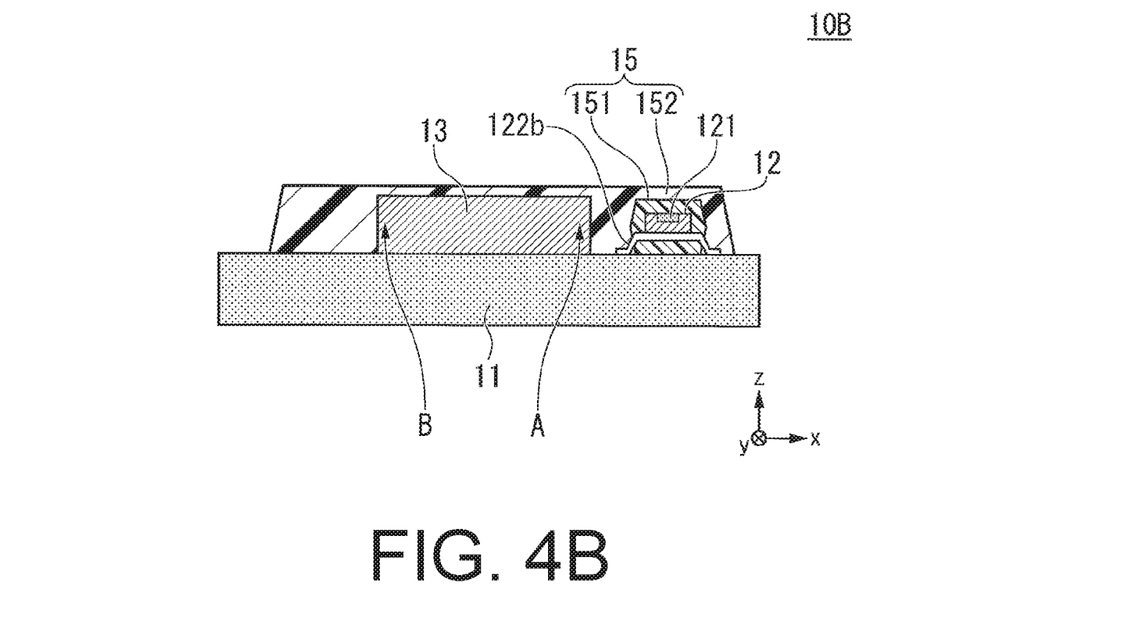
FIG. 4B is a section view taken along line 4B-4B of the magnetic substance detection sensor illustrated in FIG. 4A.

FIG. 4A is a plan view illustrating a modification of the magnetic substance detection sensor of the first embodiment of the present invention. FIG. 4B is a sectional view taken along line 4B-4B of the magnetic substance detection sensor illustrated in FIG. 4A.

The magnetic substance detection sensor 10B illustrated in FIGS. 4A and 4B is different from the magnetic substance detection sensor 10 illustrated in FIGS. 1A and 1B only in terms of the shape of the conductive layer 151. Accordingly, in the magnetic substance detection sensor 10B illustrated in FIGS. 4A and 4B, the same members as those in the magnetic substance detection sensor 10 are denoted by the same reference numerals, and their dual explanations will be omitted.

The conductive layer in the modification illustrated in FIG. 4B is a lead frame 122b. The semiconductor chip 12 having the magnetic field detection element 121 is placed on the lead frame 122b.

As illustrated in FIG. 4B, the lead frame 122b and the semiconductor chip 12 are integrated by the sealing with the resin layer 151 and fixed to a predetermined position on a support substrate 11. In the magnetic substance detection sensor 10B illustrated in FIG. 4B, the resin layer 151 hence exists in a part between the lead frame 122b and the support substrate 11.

As illustrated in FIGS. 4A and 4B, the lead frame 122b is partly exposed from the resin layer 151. Of the lead frame 122b, the part exposed from the resin layer 151 is electrically connected by soldering or the like to an unillustrated wiring made of a conductive material such as Cu, which is disposed on the support substrate 11.

In the present modification, the resin layer 151 covers only the upper and side surfaces of the semiconductor chip 12, a part of a surface (a lower surface in FIG. 4B), on which the semiconductor chip 12 is not placed, of the lead frame 122b, and the vicinity of a boundary between the lead frame 122b and the semiconductor chip 12.

In the present modification, a resin layer 152 covers the upper and side surfaces of a permanent magnet 13 and the resin layer 151, the lead frame 122b uncovered with the resin layer 151, and a part of an upper surface of the support substrate 11 which is not covered with the resin layer 151. In the present modification, other possible elements and a wiring made of a conductive material such as Cu and the like which are provided on the support substrate 11 and which are not illustrated in the drawings are preferably covered by the resin layer 152.

The magnetic substance detection sensor 10B illustrated in FIGS. 4A and 4B can be manufactured by, for example, a manufacturing method shown below.

First, a semiconductor chip 12 is manufactured in a manner similar to the above-described manufacturing method of the magnetic substance detection sensor 10 illustrated in FIGS. 1A and 1B.

Next, the semiconductor chip 12 is bonded on the lead frame 122b by, for example, conductive material paste. After that, the lead frame 122b and the semiconductor chip 12 are electrically connected by a bonding wire, for example.

Subsequently, a resin layer 151 is formed to cover only the upper and side surfaces of the semiconductor chip 12, the bonding wire (not illustrated), a part of the surface (the lower surface in FIG. 4B), on which the semiconductor chip 12 is not placed, of the lead frame 122b, and the vicinity of the boundary between the lead frame 122b and the semiconductor chip 12, for example, by molding to seal the part of the lead frame 122b and the semiconductor chip 12.

Afterwards, conductive material paste is printed at a predetermined position on the support substrate 11, and the lead frame 122b and the semiconductor chip 12 integrated by the resin layer 151 are placed thereon, followed by heating in a reflow furnace for fixing. The lead frame 122b and the semiconductor chip 12 are hence fixed to the predetermined position on the support substrate 11.

Next, in a manner similar to the above-described magnetic substance detection sensor 10 illustrated in FIGS. 1A and 1B, a permanent magnet 13 is fixed to a predetermined position on the support substrate 11.

After that, the resin layer 152 covering the permanent magnet 13, the upper and side surfaces of the resin layer 151, the lead frame 122b uncovered with the resin layer 151, and a part of the upper surface of the support substrate 11 uncovered with the resin layer 151 is formed for sealing by, for example, hot-melt mold.

The magnetic substance detection sensor 10B illustrated in FIGS. 4A and 4B is obtained by the processes described above.

The magnetic substance detection sensor 10B illustrated in FIGS. 4A and 4B has a resin encapsulation layer 15 having the resin layer 151 exposing the permanent magnet 13 and covering the semiconductor chip 12, and the resin layer 152 continuously covering the permanent magnet 13 and the resin layer 151, and stress caused by curing contraction of the resin layer 152 is smaller than that of the resin layer 151. For this reason, as with the above-described magnetic substance detection sensor 10 illustrated in FIGS. 1A and 1B, in the magnetic substance detection sensor 10B package stress applied to the semiconductor chip 12 is reduced and the proximity of an object of detection is detected with high accuracy, as compared with the case of the resin encapsulation layer of a single layer.

Second Embodiment

Figure 5A:
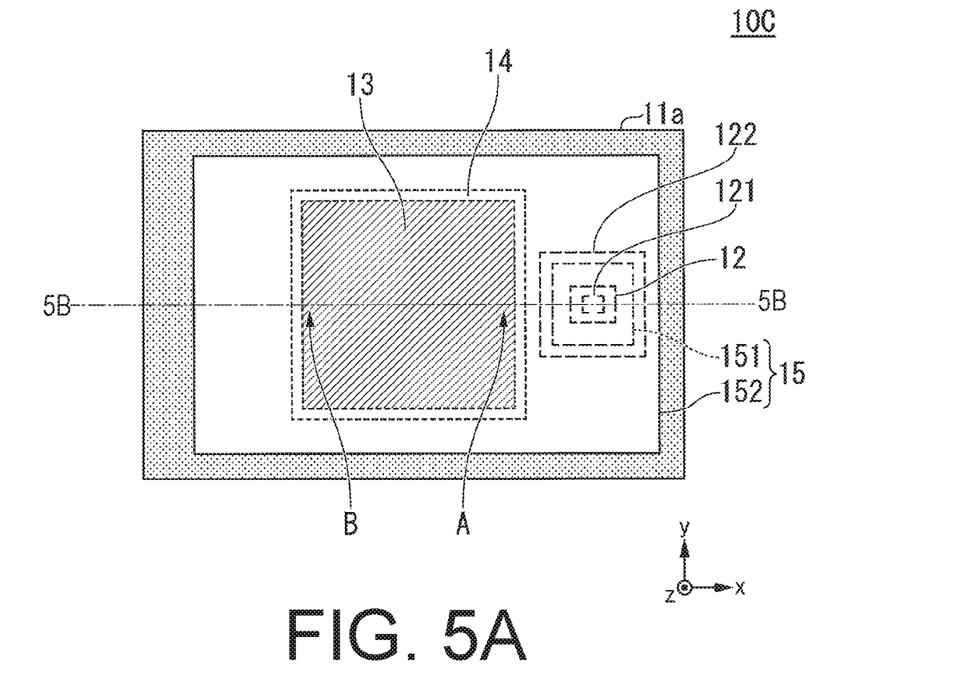
FIG. 5A is a plan view illustrating a magnetic substance detection sensor of the second embodiment of the present invention.
Figure 5B:
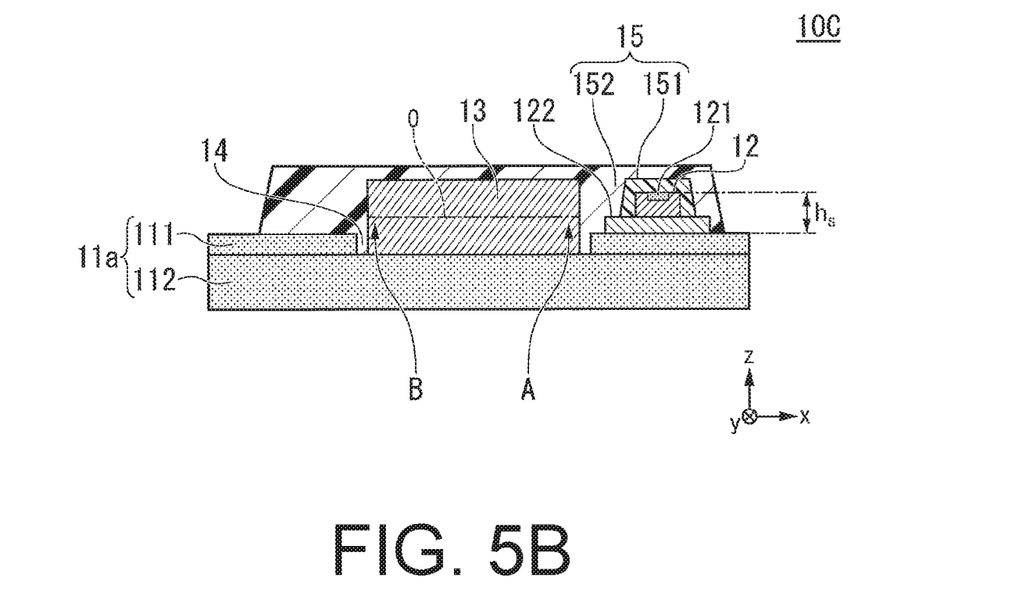
FIG. 5B is a sectional view taken along line 5B-5B of the magnetic substance detection sensor illustrated in FIG. 5A.

FIG. 5A is a plan view illustrating a magnetic substance detection sensor of the second embodiment of the present invention. FIG. 5B is a sectional view taken along line 5B-5B of the magnetic substance detection sensor illustrated in FIG. 5A.

The magnetic substance detection sensor 10C of the second embodiment is different from the magnetic substance detection sensor 10 of the first embodiment in terms of the shape of a support substrate, and a positional relation in the z-axis direction illustrated in each of FIG. 1B and FIG. 5B between the semiconductor chip 12 and the permanent magnet 13. Hence, in the second embodiment, the same members as those in the first embodiment are denoted by the same reference numerals, and their dual explanations will be omitted.

As illustrated in FIGS. 5A and 5B, a support substrate 11a included in the magnetic substance detection sensor 10C of the second embodiment has a recess 14 approximately at the center in plan view.

The support substrate 11a is constituted of a support substrate 112 (the second support substrate) and a support substrate 111 (the first support substrate) fixed to the support substrate 112.

As the support substrate 112, for example, a rigid substrate, an aluminum substrate, a Bakelite substrate and the like can be used.

As the support substrate 111, for example, a rigid substrate may be used, or a flexible substrate may be used. A through-hole corresponding to the recess 14 is opened approximately at the center of the support substrate 111 in plan view. The surface of the support substrate 111 is preferably formed of a material having high adhesion with the resin layer 152 of the resin encapsulation layer 15.

As illustrated in FIGS. 5A and 5B, the support substrate 11a can be constituted of the support substrate 112 and the support substrate 111 having the through-hole corresponding to the recess 14, but may be manufactured by cutting an approximately central part of a single printed circuit board in plan view to form a recess.

In FIG. 5B, reference numeral O indicates a central surface in the z-axis direction of the permanent magnet 13. Reference numeral hs indicates the height from the surface of the support substrate 11a to the upper surface of the magnetic field detection element 121.

In the magnetic substance detection sensor 10C, the permanent magnet 13 is disposed in the recess 14 provided on the support substrate 11a. In the magnetic substance detection sensor 10C, the thickness of the permanent magnet 13 can thus be made thick as compared with the magnetic substance detection sensor 10 of the first embodiment. The thickness of the permanent magnet 13 can be set twice or more the height hs from the surface of the support substrate 11a to the upper surface of the magnetic field detection element 121 as illustrated in FIG. 5B.

As illustrated in FIGS. 5A and 5B, the semiconductor chip 12 is provided over the support substrate 11a through the conductive layer 122 provided in a region other than the recess 14 on the support substrate 11a. As with the magnetic substance detection sensor 10 of the first embodiment, the semiconductor chip 12 includes the magnetic field detection element 121.

In the magnetic substance detection sensor 10C, the resin layer 152 covers the upper and side surfaces of the permanent magnet 13 and resin layer 151, the inside of the recess 14, the conductive layer 122 uncovered with the resin layer 151, and a part of the upper surface of the support substrate 11a uncovered with the resin layer 151. In the second embodiment, a wiring made of a conductive material such as Cu and other possible elements which are provided on the support substrate 11a, both not illustrated though, are preferably covered by the resin layer 152.

Next, the operation of the magnetic substance detection sensor 10C will be described.

In the magnetic substance detection sensor 10C, the magnetic field detection element 121 detects the amount of change (Bz1-Bz0) in magnetic field component of an unillustrated object of detection approaching from the positive direction of the z-axis illustrated in FIGS. 5A and 5B. The amount of change (Bz1-Bz0) in the magnetic field component which is detected by the magnetic field detection element 121 can be made large by satisfying two conditions (1) and (2) listed below:

(1) The thickness of the permanent magnet 13 in the z-axis direction is large, and (2) The magnetic field detection element 121 lies on the upper side (the side apart from the support substrate 11a) above the plane O being the center surface in the z-axis direction of the permanent magnet 13.

That is, in the magnetic substance detection sensor 10C, the thickness in the z-axis direction of the permanent magnet 13 is made thick, and the above conditions of (1) and (2) can be optimized simultaneously by the value of the depth of the recess 14. As a result, the absolute value of the magnetic field applied to the magnetic field detection element 121 becomes large, and the sensitivity of the magnetic substance detection sensor 10C is enhanced.

On the other hand, in the magnetic substance detection sensor 10 of the firm embodiment including the support substrate 11 having no recess 14, as illustrated in FIG. 1B, the magnetic field detection element 121 is disposed on the side (the side near the support substrate 11) lower than the central surface in the z-axis direction of the permanent magnet 13 as the thickness of the permanent magnet 13 becomes thicker. Accordingly, in the magnetic substance detection sensor 10 of the first embodiment, the increase in the amount of change (Bz1-Bz0) in the magnetic field component by increasing the thickness of the permanent magnet 13 is smaller than that in the magnetic substance detection sensor 10C, of the second embodiment.

Since the support substrate 11a has the recess 14 in the magnetic substance detection sensor 10C, the sensitivity can be enhanced by the thick permanent magnet 13, for example.

Also, in the second embodiment, the permanent magnet 13 can be arranged along the inner wall surface of the recess 14 in the process of fixing the permanent magnet 13 on the support substrate 11a in manufacturing the magnetic substance detection sensor 10C. Accordingly, in the magnetic substance detection sensor 10C, the accuracy of arrangement of the permanent magnet 13 in the xy plane becomes high as compared with the magnetic substance detection sensor 10 of the first embodiment. As a result, the magnetic substance detection sensor 10C of the present embodiment becomes more accurate.

Further, in the magnetic substance detection sensor 10C, as with the magnetic substance detection sensor 10 of the first embodiment, the resin encapsulation layer 15 has the resin layer 151 and the resin layer 152, and stress caused by curing contraction of the resin layer 152 is smaller than that of the resin layer 151. Accordingly, as with the magnetic substance detection sensor 10 of the first embodiment, the magnetic substance detection sensor 10C has a reduced package stress applied to the semiconductor chip 12 and is capable of detecting the proximity of the object of detection with high accuracy, as compared with the case of the resin encapsulation layer of a single layer. In addition, according to the magnetic substance detection sensor 10C, as with the magnetic substance detection sensor 10 of the first embodiment, the semiconductor chip 12 and the permanent magnet 13 is protected from mechanical stimulation and water by the resin encapsulation layer 15, and the package stress can be reduced without impairing reliability.

Figure 6:
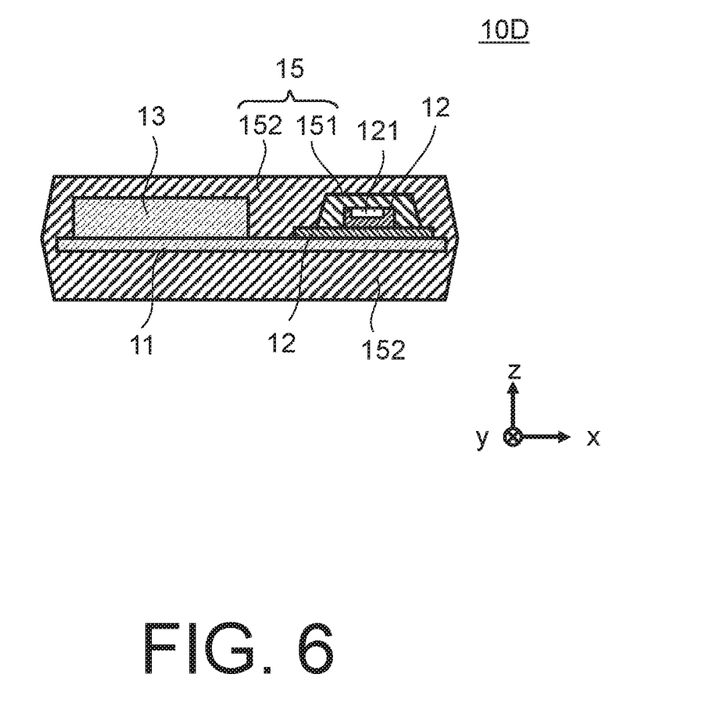
FIG. 6 is a sectional view illustrating another modification of the magnetic substance detection sensor of the first embodiment of the present invention.

Although the above-described embodiment has been described by taking as an example the case where the resin encapsulation layer 15 is formed only on one of the surfaces of each of the support substrates 11 and 11a, the resin encapsulation layer may be provided on both surfaces including the rear surface being the other surface of the support substrate. For example, both entire surfaces of the support substrate may be covered with the second resin layer 152. FIG. 6 is a sectional view of another modification of the magnetic substance detection sensor of the first embodiment of the present invention and illustrates a sectional view of a magnetic substance detection sensor 10D in which both entire surfaces of a support substrate 11 are covered by the second resin layer 152.

Figure 7:
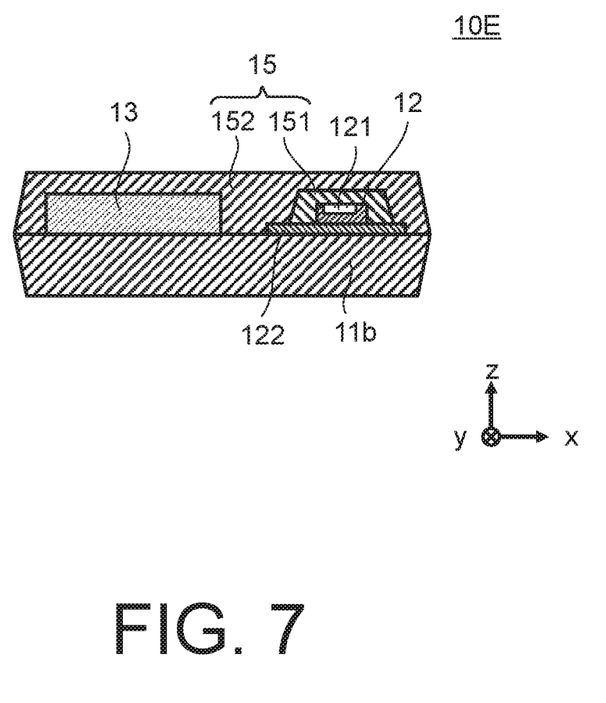
FIG. 7 is a sectional view illustrating a further modification of the magnetic substance detection sensor of the first embodiment of the present invention.

Although the above-described embodiment has been described by taking as an example the case where each of the support substrates 11 and 11a is constituted of the rigid substrate or the flexible substrate, a support substrate 11b may be formed of other materials, e.g., the same material as that for the second resin layer 152 as illustrated in FIG. 7. FIG. 7 is a sectional view illustrating a further modification of the magnetic substance detection sensor of the first embodiment of the present invention, and illustrates a sectional view of a magnetic substance detection sensor 10E in which the support substrate 11b is formed of the same material as that for the second resin layer 152. The drawing indicates the manner in which a semiconductor chip 12 having a magnetic field detection element 121 and a permanent magnet 13 both covered with a first resin layer 151 are covered by the second resin layer 152 from above, and covered by the support substrate 11b formed of the same material as the second resin layer 152 from below. The support substrate 11b constitutes a second resin encapsulation layer opposite to a resin encapsulation layer 15. The support substrate 11b may be formed in a process different from the formation of the resin layer 152 or can also be formed simultaneously with the resin layer 152.

Although the magnetic substance detection sensors 10, 10B, and 10C illustrated in FIGS. 1, 4, and 5 have respectively been described by taking by way of example the case in which the resin encapsulation layers 15 are respectively formed on the parts of the upper surfaces of the support substrates 11 and 11a, the resin encapsulation layer 15 may cover the entire upper surface of the support substrate 11 as in the magnetic substance detection sensor 10A illustrated in FIG. 2.

What is claimed is:

1. A magnetic substance detection sensor, comprising:
   a support substrate;
   a semiconductor chip provided on the support substrate and having a magnetic field detection element;
   a permanent magnet provided on the support substrate; and
   a resin encapsulation layer covering the semiconductor chip and the permanent magnet,
   wherein the resin encapsulation layer comprises a first resin layer exposing the permanent magnet and covering the semiconductor chip, and a second resin layer continuously covering the permanent magnet and the first resin layer, and
   wherein stress caused by curing contraction of the second resin layer is smaller than that of the first resin layer.

2. The magnetic substance detection sensor according to claim 1, wherein a glass transition temperature of the first resin layer is higher than that of the second resin layer.

3. The magnetic substance detection sensor according to claim 1, wherein an elastic modulus of the first resin layer is larger than that of the second resin layer.

4. The magnetic substance detection sensor according to claim 1, wherein the permanent magnet is disposed in a recess provided in the support substrate.

5. The magnetic substance detection sensor according to claim 1, wherein the second resin layer further covers a rear surface of the support substrate on which the first resin layer and the permanent magnet are not provided.

6. The magnetic substance detection sensor according to claim 1, wherein the support substrate is formed of the same material as that of the second resin layer.

* * * * *